United States Patent [19]

Naffziger

[11] Patent Number: 5,760,610
[45] Date of Patent: Jun. 2, 1998

[54] QUALIFIED UNIVERSAL CLOCK BUFFER CIRCUIT FOR GENERATING HIGH GAIN, LOW SKEW LOCAL CLOCK SIGNALS

[75] Inventor: Samuel D. Naffziger, Fort Collins, Colo.

[73] Assignee: Hewlett-Packard Company, Palo Alto, Calif.

[21] Appl. No.: 609,306

[22] Filed: Mar. 1, 1996

[51] Int. Cl.⁶ .................................................... H03K 19/00
[52] U.S. Cl. .................................. 326/93; 326/97; 326/98
[58] Field of Search .......................... 326/21, 93, 97–98, 326/121

[56] References Cited

U.S. PATENT DOCUMENTS

| | | |
|---|---|---|
| 4,338,677 | 7/1982 | Morrill, Jr. et al. . |
| 5,057,701 | 10/1991 | Miller, Jr. . |
| 5,124,572 | 6/1992 | Mason et al. . |
| 5,148,052 | 9/1992 | Yellamilli . |
| 5,164,619 | 11/1992 | Luebs . |
| 5,257,214 | 10/1993 | Mason et al. . |
| 5,289,403 | 2/1994 | Yetter . |
| 5,299,158 | 3/1994 | Mason et al. . |
| 5,306,962 | 4/1994 | Lamb . |
| 5,317,204 | 5/1994 | Yetter et al. . |
| 5,329,176 | 7/1994 | Miller, Jr. et al. . |
| 5,434,520 | 7/1995 | Yetter et al. . |
| 5,541,536 | 7/1996 | Rajivan ................................ 326/98 |
| 5,612,638 | 3/1997 | Lev ....................................... 326/98 |
| 5,614,845 | 3/1997 | Masleid ............................... 326/93 |
| 5,646,556 | 7/1997 | Longwell et al. ................... 326/93 |

*Primary Examiner*—Jon Santamauro

[57] ABSTRACT

A universal qualified clock buffer circuit for generating high-performance, low-skew local clock signals from a single-phase source clock is presented. The universal qualified clock buffer circuit independently generates a separate clock signal from the single-phase clock signal and provides for conditional signal qualification for those logic circuits which require both control signals and clock signals to regulate the flow of data. An important aspect of the universal qualified clock buffer circuit is that delays on the output signal can be independently controlled. In a CMOS implementation, the delays of both rising and falling edges of the output signal are independently controlled using different FET sizes. To control skew and edge-rate uniformity, the universal qualified clock buffer circuit is capacitively matched to the impedance load of the circuit it drives.

12 Claims, 8 Drawing Sheets

"DEADTIME"

QUALIFIED UNIVERSAL CLOCK BUFFER CIRCUIT FOR GENERATING HIGH GAIN, LOW SKEW LOCAL CLOCK SIGNALS

FIELD OF THE INVENTION

The present invention relates generally to clock buffer circuits used in VLSI processors, and, more particularly, to a universal qualified clock buffer circuit for generating high gain, low skew qualified local clock signals from a single-ended source clock.

BACKGROUND OF THE INVENTION

The performance of very large scale integration (VLSI) systems has been improved by developing methods and designing hardware which can handle greater clock frequencies. One method for handling greater clock frequencies is a method known as "pipelining". In this method, a dual-phase clocking scheme is used, which is generally implemented using a pair of differential symmetric clocks generated by a centralized clocking circuit. In the simple pipeline scheme, logic for implementing operations are divided into pipeline stages, whereby each stage represents one clock cycle. Alternating stages receive the differential clock signals, CK1 and CK2. Thus, while a given pipeline stage performs an operation during its CK1 enable phase, the immediately subsequent pipeline stage, which depends on the output of the given pipeline stage, waits during its CK2 disable cycle. Then, when CK1 enters the disable cycle, CK2 enters the enable cycle, and the immediately subsequent pipeline stage performs an operation.

Unfortunately, since typical pipelined data processing systems generally use global clocks, the skew and the rise/fall times of the clocking signals received by the respective pipelined circuits are poorly controlled. Uncontrollable skew is introduced by the different logic blocks. Since logic blocks perform different functions, most logic blocks in a microprocessor are implemented with differing logic structure. Thus, during operation, the logic path taken in any given logic block is unpredictable. Differing capacitance and resistive loads caused by the various logic paths taken result in clock skew. In other words, the differences in logic blocks make it nearly impossible to match the rising and falling edges of CK1 and CK2.

In addition to varying R-C loads, variation in the fabrication process across a given chip introduces process-dependent parameter variations in the circuit components, which also results in increased clock skew.

Thus, if the skew is large, slow clock signal fall times result which, for fast circuit, causes errors in the pipeline. Such errors are herein referred to as clock signal races and are characterized by pipeline situations in which data in one stage "sneaks" through to a subsequent stage before the proper clocking signal is received. As known to those skilled in the art, lost clock edges as a result of signal skew may lead to such errors.

A solution to the uncontrollable skew of the above dual-phase clocking scheme was presented in U.S. Pat. No. 5,124,572 to Mason. The prior art solution provided a clocking methodology for VLSI chips which uses global overlapping clocks plus locally or remotely generated non-overlapping clocks. Two overlapping clocks and two non-overlapping clocks are thus available in each block of a chip for use as timing edges. Non-overlapping clock signals are typically differential clock signals in which one clock signal has a rising edge which occurs after a falling edge of the other clock signal and a falling edge which occurs before a rising edge of the other clock signal. Such signals prevent clock signal races in a pipelined circuit by deactivating a subsequent stage before data is allowed to propagate through the current stage. The global overlapping clocks are used where possible to provide timing advantage. The non-overlapping clocks provide the advantage of introducing at a local level enough non-overlapping "deadtime" between clock edges to compensate for global level clock skew. This scheme thus allowed for the prevention of race conditions between storage elements.

However, prior art non-overlapping clocking schemes are problematic. The non-overlapping clocks are generated using feedback to generate the actual deadtime. The length of deadtime is a function of the number of gate delays contained in the feedback. The problem with feedback dependency is that is scales poorly with frequency. In other words, the deadtime length is independent of frequency and remains the same regardless of the frequency of the clock. Thus, the percentage of the phase allotted to deadtime increases as the frequency of the clock increases, resulting in a smaller percentage of the enable phase to perform the actual operations.

Another problem with the non-overlapping clocking scheme is that the non-overlapping clocks CK1N and CK2N always toggled. In CMOS technology, power is a function of the frequency of changes in voltage and capacitance. Thus, the continuous toggling of the non-overlapping clocks results in poor power performance specifications.

In addition, non-overlapping clock circuits had to be used in pairs regardless of which of the two global phases was to be deraced.

Another disadvantage of the non-overlapping two-phase clocking scheme was that it did not provide qualification to generate conditional pulses. One prior art solution. U.S. Pat. No. 5,306,962 to Lamb, added qualification to the non-overlapping clock generator to provide control lines with non-overlapping clock timing. However, this solution still suffers from the same disadvantages mentioned above with respect to the non-overlapping clock scheme.

Global overlapping clocks generally provide timing advantages with respect to non-overlapping clocks in that there is no dead time between a falling edge of one clock signal and the rising edge of the other clock signal. As a result, early clock edges may be received which allow improved system performance of the pipelined circuits. Global overlapping clocks are also generally easier to distribute to the circuitry without closely controlling the clock skew caused by time/phase shifts. However, as just noted, if the clock skew is large, race conditions may be created which may cause information to be lost when only global overlapping clocks are used for clocking the pipelined circuits.

Accordingly, it is desired to provide a universal qualified clock buffer circuit for generating high gain, low skew qualified clock signals from a single-ended source clock which scales well with frequency, consumes less power, and allows overlapping clocks to be used where appropriate to improve system performance.

SUMMARY OF THE PRESENT INVENTION

Therefore, in accordance with the present invention, there is provided a universal qualified clock buffer circuit for generating high gain, low skew qualified clock signals from a single-phase source clock. The universal qualified clock buffer circuit includes a first NOR gate and a first NAND gate which each receive a single-phase clock signal at respective first NAND input and first NOR input thereof. In addition to the single-phase clock signal, the first NOR gate also receives a first feedback signal, to produce a pulldown signal. Likewise, the first NAND gate also receives a second feedback signal, and produces a pullup signal. A push-pull circuit receives the pullup signal and the pulldown signal and produces an inverted output signal at an inverted output node. A first inversion device receives the inverted output signal and a first zero-to-n bit qualifier signal to produce a first feedback signal for input to the first NOR gate. A second inversion device receives the inverted output signal and a second zero-to-n bit qualifier signal to produce a second feedback signal for input to the first NAND gate. An output inverter receives the inverted output signal and produces an output signal at an output node. A feedback inverter is coupled between the output node and the inverted output node. An optional input inverter may be coupled between the input and the inputs of the first NAND gate and the first NOR gate to a provide complementary output signal. In the preferred embodiment, the first inversion device comprises a one-to-n bit NAND gate, and the second inversion device comprises a one-to-n bit NOR gate.

An important aspect of the universal qualified clock buffer circuit is that delays on the output signal can be independently controlled. In a CMOS implementation, the delays of both rising and falling edges of the output signal are independently controlled using different FET sizes. Another important aspect of the universal qualified clock buffer circuit that it must be capacitively matched to the impedance load of the circuit it drives.

The advantages realized by the present invention are many. The clock drive strength may be more efficiently tuned to local block loads for better skew control and edge-rate uniformity. Each local clock signal phase (CK1, CK2, CK1N, CK2N) is generated by an independent third level clock buffer circuit without being paired with other circuits, resulting in less required chip area. Also, each third-level buffer circuit can be qualified to generate conditional pulses, including register set, register dump, global driver control lines, pre-charge clock lines, power-down and test mode feature lines. Furthermore, isolation of a single-phase global clock from random local block routes improves the RC component of the single-phase global clock throughout the chip.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which.

DETAILED DESCRIPTION OF THE INVENTION

The drawings, in general, depict a universal qualified clock buffer circuit for generating high-gain, low-skew qualified local clock signals from a single-ended source clock. In particular, there is shown a universal qualified clock buffer circuit which receives a single-ended source clock and a qualifier signal, and which produces a high-gain, low-skew local clock signal. Each universal qualified clock buffer circuit is designed to capacitively match the load impedance of the circuit it drives. The universal qualified clock buffer output signal is generally one of four possible signals: an overlapping clock signal CK1, CK2, or a non-overlapping clock signal CK1N, CK2N. Clock signals CK1 and CK1N have coincident falling edges, and clock signals CK2 and CK2N have coincident falling edges. Because each universal qualified clock buffer circuit is implemented identically in structure, all localized universal qualified clock buffer output signals experience the same relative phase delay. Thus, the falling edges of like universal qualified clock buffer output signals maintain a very low clock skew relative to all other similarly generated universal qualified clock buffer output signals.

Figure 1:
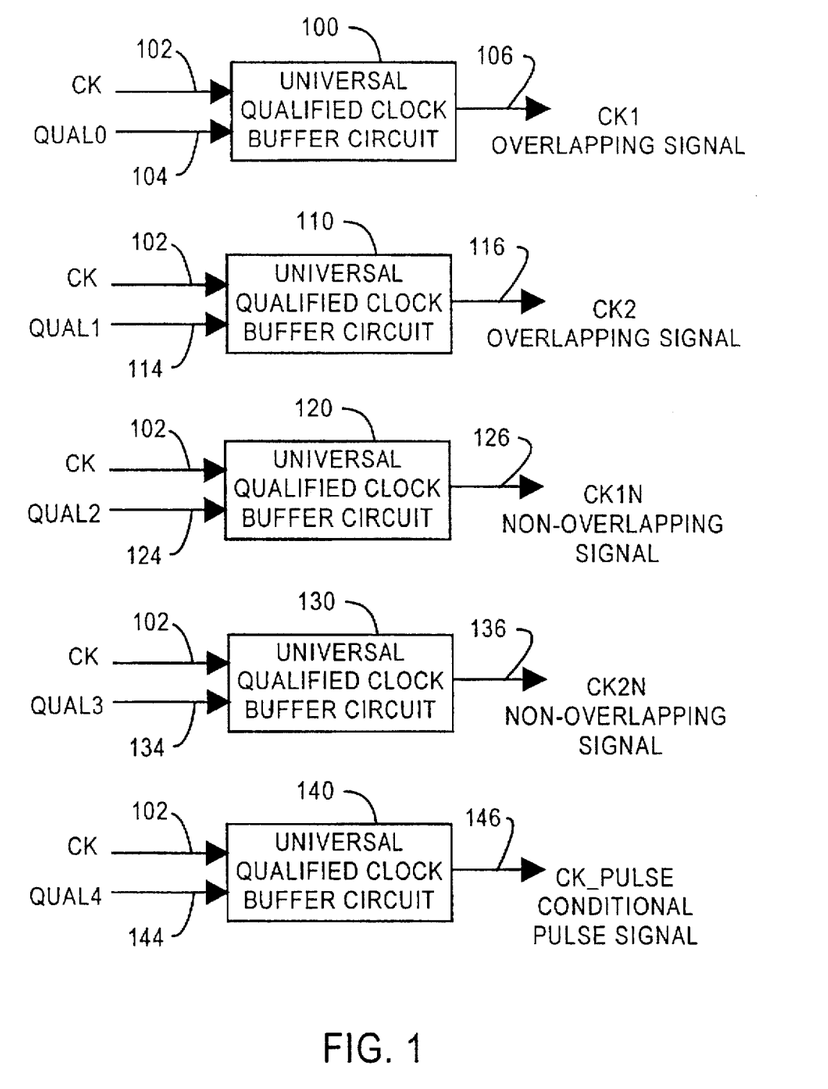
FIG. 1 illustrates a set of universal qualified clock buffer circuits in accordance with the present invention.

FIG. 1 illustrates a set of universal qualified clock buffer circuits which generate different local clock signals CK1, CK2, CK1N, CK2N and a conditional pulse $CK_{pulse}$. As shown in FIG. 1, five independent universal qualified clock buffer circuits 100, 120, 130, 140, 150 receive a global single-phase clock signal CK 102. Each of the five independent universal qualified clock buffer circuits 100, 120, 130, 140, 150 also receive respective qualifier signals QUAL0 104, QUAL1, 114, QUAL2 124, QUAL3 134, QUAL4 144, which may originate from a single source or a plurality of independent sources.

The four independent universal qualified clock buffer circuits 100, 120, 130, 140, 150 shown in FIG. 1 generate the four respective clock signals CK1, CK2, CK1N, CK2N on a continuous basis as qualified by their respective qualifier signals QUAL0 104, QUAL1, 114, QUAL2 124, QUAL3 134. Typically, when a universal qualified clock buffer circuit is used to generate a local clock signal, the qualifier input signal will be tied high or low (depending on the logic) to allow the universal qualified clock buffer output signal to follow the input global single-phase clock signal. However, in certain instances, a given application may require a clock signal only at certain times; and thus the qualifier signal will act as a clock enable signal. Because each of the four local clock signals CK1, CK2, CK1N, CK2N in FIG. 1 are generated with independent circuits, the number of universal qualified clock buffer circuits implemented in a given system may be varied as required by the logical function of the circuit. This conserves space by not requiring implementation of clock signal circuits which generate unnecessary clock signals. Thus, overlapping clocks CK1 and/or CK2 should be used where speed is important and race conditions are not a problem. Clock signals CK1N and/or CK2N should be used where race conditions are a problem. The ability to independently generate each clock signal CK1, CK2, CK1N, CK2N allows each universal qualified clock buffer circuit to be implemented only if its clock signal is required. This conserves space by not requiring implementation of clock signal circuits which generate unnecessary clock signals.

The universal qualified clock buffer circuit 140, on the other hand, is used to generate a conditional pulse $CK_{pulse}$. Typically, the qualifier signal input QUAL4 144 will be a control line, such as an output signal of combinational logic. In this instance, the qualifier signal QUAL4 is typically low (or high, depending on the logic) to disallow the universal qualified clock buffer output signal $CK_{pulse}$ 146 from following the input clock signal CK 102. The, when the qualifier signal QUAL4 144 pulses high, a single clock pulse is generated on the universal qualified clock buffer output signal $CK_{pulse}$. The qualifier features of the universal qualified clock buffer circuit synchronize asynchronous conditional pulses with local clock signals in a system. In other words, because a single universal qualified clock buffer circuit accepts a global single-phase clock signal and a control signal, there is no difference in delay between qualified conditional pulse signals and locally generated clocks. The conditional pulse will have coincident falling edges to other like universal qualified clock buffer output signals. The advantages realized by providing qualification for generating conditional pulses include reduced power consumption since the conditional pulses fire only when required, standardized de-racing circuits which eliminate design-dependent races, and reduced loading on the global single-phase clock signal CK.

Another important aspect of the universal qualified clock buffer circuit circuits 100, 110, 120, 130, 140 is their high capacitive gain. Each universal qualified clock buffer circuit 100, 110, 120, 130, 140 must be designed to drive a very large output capacitance relative to its input capacitance in order to minimize the skew of the local clock signals to allow for precise local clock control. In addition, each universal qualified clock buffer circuit 100, 110, 120, 130, 140 must be capacitively matched to the load impedance of the circuit it drives in order to ensure that similar universal qualified clock buffer output signals generated by other independent universal qualified clock buffer circuits experience the same relative delay to minimize local clock skew. In the preferred embodiment, a universal qualified clock buffer circuit may be replicated and combined in parallel to drive a load heavier than that rated for a single universal qualified clock buffer circuit. Parallel combination, discussed hereinafter, increases the driving capability of a universal qualified clock buffer circuit without affecting the delay time of its universal qualified clock buffer output signal. Furthermore, it is also contemplated that additional capacitors be used wherever possible to help balance loads.

Figure 2:
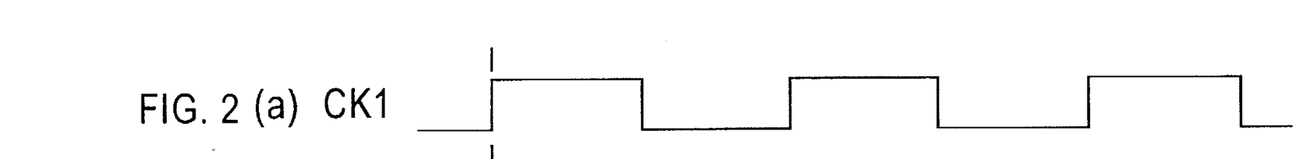
FIGS. 2(a)–(d) illustrate the timing relationships of two overlapping clocking signals (FIGS. 2(a) and 2(b)) and two non-overlapping clock signals (FIGS. 2(c) and 2(d)) generated by four independent universal qualified clock buffer circuits.

FIGS. 2(a)–2(d) illustrate the timing relationships of four example universal qualified clock buffer output signals CK1, CK2, CK1N, and CK2N. As shown in FIGS. 2(a) and 2(b), CK1 and CK2 are differential overlapping clock signals. CK1 and CK2 are symmetrical, wherein the rising edges of CK1 are coincident to the falling edges of CK2 and the falling edges of CK1 are coincident to the rising edges of CK2. Thus, the rising and falling edges for CK1 and CK2 have equal delays from the global single-phase clock signal edge CK. CK1N and CK2N, on the other hand, are differential non-overlapping clock signals having a dead time between the time one clock falls and the other clock rises, as shown in FIGS. 2(c) and 2(d). The amount of dead time is bounded in the slow case by the total skew encountered in the clocks, and in the fast case by the minimum amount required to guarantee no races.

As also shown in FIGS. 2(a)–2(d), the falling edges of CK1 and CK1N are coincident, having equal delays from the received edges of the global single-phase clock signal CK. By symmetry, the falling edges of CK2 and CK2N are also coincident, having equal delays. Since each universal qualified clock buffer circuit is identically implemented, receives the same tightly controlled synchronous global clock signal CK, and is load matched to its corresponding localized logic block, each universal qualified clock buffer circuit generates skew to the same relative degree as each other universal qualified clock buffer circuit on the integrated circuit.

Figure 3:
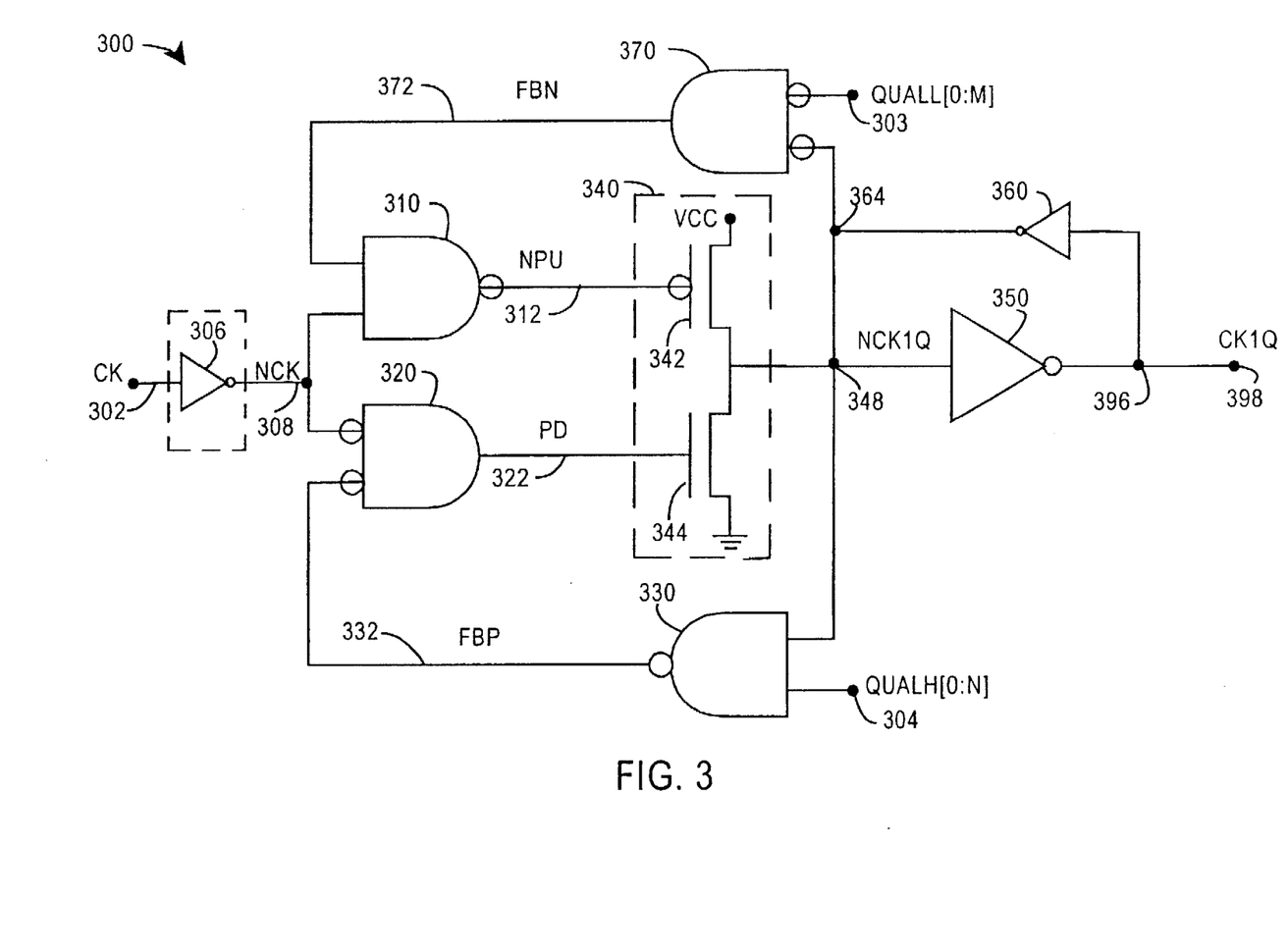
FIG. 3 is a logic diagram of the preferred embodiment of a universal qualified clock buffer circuit in accordance with the present invention.

FIG. 3 is a high-level logic block diagram of the preferred embodiment of the universal qualified clock buffer circuit in accordance with the present invention. As shown in FIG. 3, the universal qualified clock buffer circuit, shown generally at 300, receives three input signals—a single-phase clock signal CK 302, a falling-edge qualifier signal QUALL 303, and a rising-edge qualifier signal QUALH 304. As also shown in FIG. 3, the qualifier signal QUALL 303 and QUALH 304 may comprise between zero and N bits. When a qualifier signal QUALL 303, QUALH 304 comprises zero bits, it simply means that the respective falling/rising edge of the single-phase clock signal CK is not qualified and therefore always transitions.

As shown in FIG. 3, the universal qualified clock buffer circuit 300 includes an optional input inverter 306. The input inverter 306 is used when it is desired to generate a complementary output signal of another identically implemented universal qualified clock buffer circuit. The input inverter 306 inverts the single-phase clock signal CK to produce an inverted single-phase clock signal NCK 308.

The universal qualified clock buffer circuit 300 includes a first NAND gate 310 and a first NOR gate 320. The first NAND gate 310 receives the inverted global single-phase clock signal NCK 308 and a negative feedback signal FBN 372 to produce an inverted pullup signal NPU 312 at its output. The first NOR gate 320 also receives the inverted single-phase clock signal NCK 308 and a positive feedback signal 332 to produce a pull-down signal PD 322 at its output.

The universal qualified clock buffer circuit 300 also comprises a push-pull circuit 340. The push-pull circuit 340 receives the inverted pullup signal NPU 312 and the pulldown signal PD 322 to produce an inverted universal qualified clock buffer output signal NCK1Q 364 at an inverted output node 348. The universal qualified clock buffer circuit comprises a push FET 342 coupled in drain-source relationship with a pull FET 344. The push FET 342 has a source coupled to a power supply VDD, a gate coupled to receive the inverted pullup signal NPU 312, and a drain coupled to both the source of the pull FET 344 and the inverted output node 348. The push FET 344 has a source coupled to both the drain of the push FET 342 and the inverted output node 348, a gate coupled to receive the pulldown signal PD 322, and a drain coupled to the chip ground. In the preferred embodiment, the push FET 342 is implemented using a PFET and the pull FET 344 is implemented using an NFET.

As also shown in FIG. 3, the universal qualified clock buffer circuit 300 includes a first inversion device 370 and a second inversion device 330. The first inversion device 370 receives the falling-edge qualifier signal QUALL 303 and the inverted universal qualified clock buffer output signal NCK1Q 364 to produce the negative feedback signal FBN 372. The second inversion device 330 receives the rising-edge qualifier signal QUALH 304 and inverted universal qualified clock buffer output signal NCK1Q 364 to produce the positive feedback signal FBP 332. In the preferred embodiment, the first inversion device 370 is implemented using a multi-input NOR gate. The number of inputs required of the first inversion device 370 is M+1, where M is the number of bits used by the falling-edge qualifier signal QUALL 303, where M may range from 0 to any positive number M. In the preferred embodiment, the second inversion device 330 is implemented using a multi-input NAND gate. The number of inputs required of the second inversion device 330 is N+1, where N is the number of bits used by the rising-edge qualifier signal QUALH 304, where N may range from 0 to any positive number N.

The universal qualified clock buffer circuit 300 also includes an output inverter 350 which is coupled to receive the inverted universal qualified clock buffer output signal NCK1Q 346 to produce a universal qualified clock buffer output signal CK1Q 398 on an output node 396. The output inverter 350 has a high gain and is capacitively matched to the specific load impedance of the circuit it drives. A feedback inverter 360 is coupled between the output node 396 and the inverted output node 348 to improve noise immunity and to prevent a floating condition from occurring on the inverted universal qualified clock buffer output signal NCK1Q 346. Thus, the feedback inverter 360 drives the inverted output node 348 whenever the inverted pullup signal NPU 312 is high and the pulldown signal PD 322 is low at the same time.

Generally, the universal qualified clock buffer circuit 300 operates as a 2-input AND gate, with the global single-phase clock signal CK and the qualifier signal QUALH as inputs, in series with a 2-input OR gate with the low qualifier signal QUALL as the second OR input, to produce a universal qualified clock buffer output signal CK1Q.

When the universal qualified clock buffer circuit 300 is to be used to generate a local clock signal, CK1, CK2, CK1N, CK2N, usually the qualifier signal QUALH is tied high and the qualifier signal QUALL is tied low. This configuration causes the universal qualified clock buffer output signal CK1Q to be a delayed self-timed version of the global single-phase clock input CK. The delay of the universal qualified clock buffer output signal CK1Q is determined by the FET sizes used to implement the universal qualified clock buffer circuit.

If the universal qualified clock buffer circuit 300 is to be used to generate a conditional pulse, the qualifier signal QUALL will normally be high and qualifier signal QUALH will normally be low, causing the universal qualified clock buffer output signal output 398 to be low regardless of the toggling of the global single-phase clock signal CK input. The single-phase clock signal CK may be qualified on either the rising or falling edge of the universal qualified clock buffer output signal CK1Q 398. If it is desired to qualify the rising edge of universal qualified clock buffer output signal CK1Q 398, qualifier signal QUALH 303 should pulse (low-to-high and then high-to-low), changing states only when the single-phase clock signal CK is low. If, on the other hand, it is desired to qualify the falling edge of universal qualified clock buffer output signal CK1Q 398, qualifier signal QUALL 304 should pulse (high-to-low and then low-to-high), changing states only when the single-phase clock signal CK is high. Due to the split rising and falling edge paths through the circuit, it can easily be modified to produce delayed rising and/or falling edges of the universal qualified clock buffer output signal CK1Q without edge rate degradation which is often necessary for de-racing local circuits. This is accomplished by simply sizing down the FETs used in implementing either the second NAND gate 330 or the second NOR gate 370 to delay the NPU/PD signals and hence the falling/rising edge of universal qualified clock buffer output signal CK1Q 398.

Figure 4:
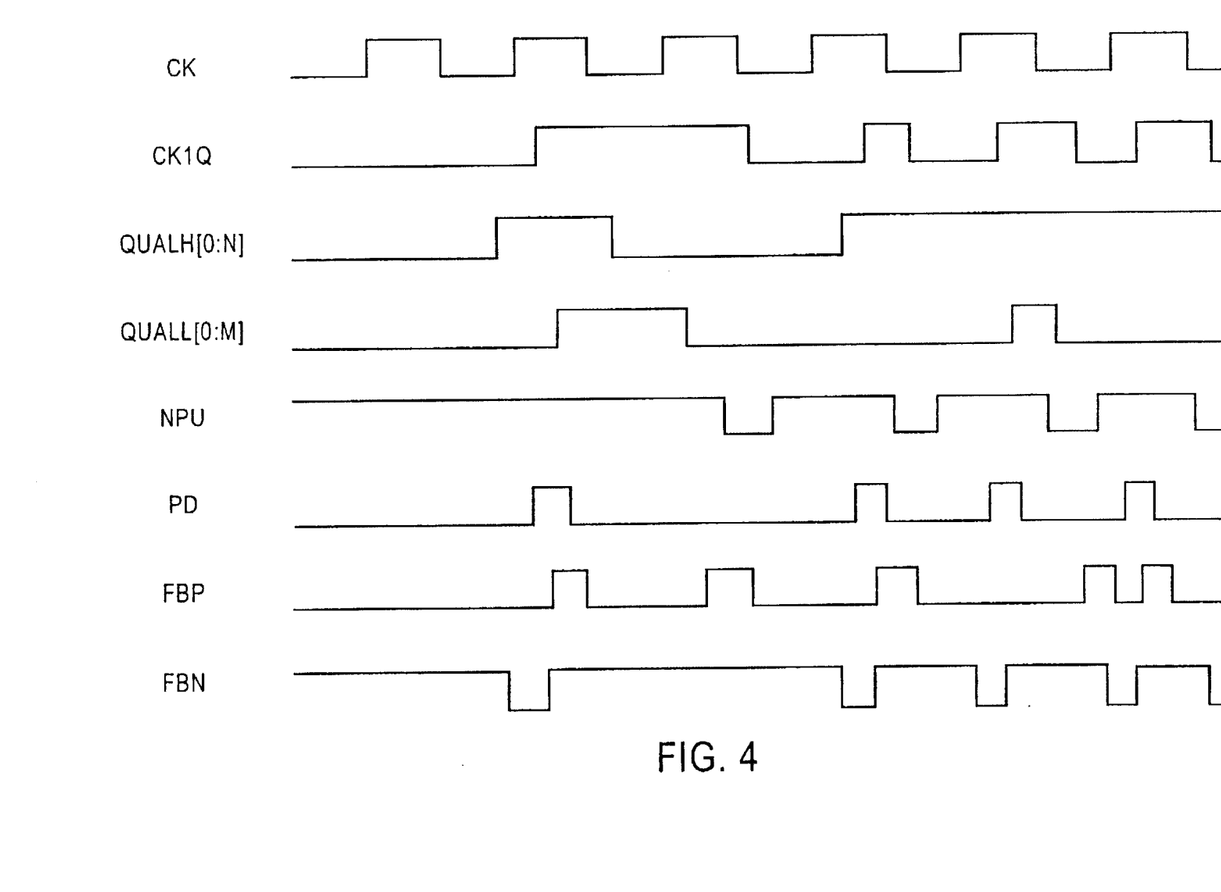
FIG. 4 illustrates the timing relationships of the universal qualified clock buffer signals shown in FIG. 3 in various modes of operation.

FIG. 4 depicts a timing diagram using exemplary input signals CK, QUALL, and QUALH to illustrate the various modes of operation of the universal qualified clock buffer circuit 300. With reference to FIGS. 3 and 4, the operation of the universal qualified clock buffer circuit 300 used for qualification is as follows. Assuming that qualifier signal QUALH 304 is initially low, the feedback signal FBP 332 will be high, causing the pulldown signal 322 to be low, in turn causing the inverted output signal NCK1Q 346 to be high, and thus the third level clock output signal CK1Q 398 will be low regardless of toggling by the input global single-phase clock signal CK 302. The third feedback inverter keeps the inverted output signal NCK1Q 346 high.

The qualifier signal QUALH 304 may transition from low to high at any time, even coincidentally with the rising edge of the global single-phase clock signal CK 304 (i.e., with zero setup time). The low to high transition of QUALH 304 causes the feedback signal FBP 332 to transition from high to low. This conditions the 2-input NOR gate 320 to expect a high to low transition by the inverted global single-phase clock signal NCK 308. When the global single-phase clock signal CK 302 transitions from low to high, the inverted global single-phase clock signal NCK transitions from high to low, causing the pulldown signal PD 322 at the output of the 2-input NOR gate 320 to transition from low to high.

Once the pulldown signal PD 322 transitions from low to high, the qualifier signal QUALH 304 is free to "reset", or transition from high to low. The operation of the universal qualified clock buffer circuit 300 is self-timed from this point because the delays in the universal qualified clock buffer circuit output signal 398 are controlled by the sized of the transistors in the circuit and the capacitive load present at the output node 396.

Thus, when the pulldown signal PD 322 transition from low to high, the NMOS pull transistor 344 turns on, pulling the inverted output signal NCK1Q 346 from high to low at inverted output node 348, and causing the universal qualified clock buffer circuit output signal CK1Q 398 to transition from low to high. The high to low transition by inverted output signal NCK1Q 346 also causes feedback signal FBP 332 to transition low to high, which in turn causes the pulldown signal to transition from high to low, thereby turning off the NMOS pull transistor 344. As this happens, inverted output signal NCK1Q 346 will be held low by third feedback invertor 360.

The universal qualified clock buffer circuit 300 remains in the above state (with CK1Q high) until the global single-phase clock input CK 302 makes a high to low transition. A high to low transition by the global single-phase clock signal CK 302 causes the inverted global single-phase clock signal NCK 308 to transition low to high, causing inverted pullup signal NPU 312 to transition high to low, thereby turning on the PMOS push transistor 342. The PMOS push transistor 342 pushes the inverted output signal NCK1Q 346 on inverted output node 348 from low to high, causing the universal qualified clock buffer circuit output signal CK1Q 398 to transition from high to low. The high to low transition by output signal CK1Q 398 causes the inverted pullup signal NPU 312 to transition from low to high, thereby turning off PMOS push transistor 342. Assuming QUALH 304 does not return to another high state, the third feedback invertor 360 holds inverted output signal NCK1Q high to maintain the universal qualified clock buffer circuit output signal CK1Q low.

When the universal qualified clock buffer circuit 300 is to be used as a clocking circuit, as noted earlier, the qualifier signal QUALH 304 is tied high to allow the output signal CK1Q 398 to follow the input global single-phase clock signal CK 302. As mentioned above, the FET sizes determine the delay time of the output signal CK1Q 398.

The operation of the universal qualified clock buffer circuit 300 used for falling-edge signal qualification is similar to that described above for rising-edge signal qualification, and is also illustrated in FIG. 4. Falling-edge qualification, using falling-edge qualifier signal QUALL, is used to qualify and possibly delay the falling edge of universal qualified clock buffer output signal CK1Q 398. Delaying falling edges is often necessary for de-racing local circuits. It is also useful in generating pre-charge signals in some situations.

Figure 5:
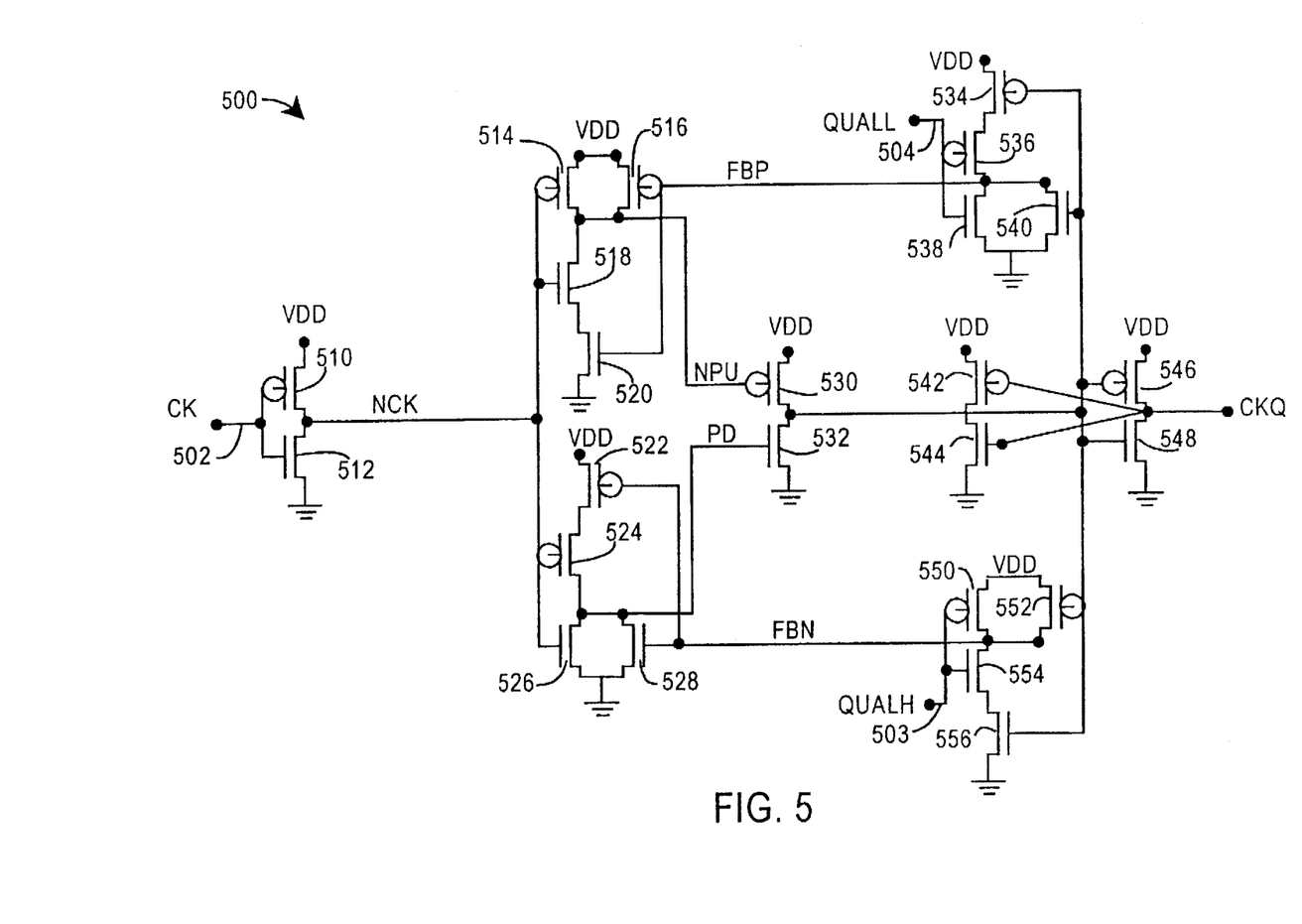
FIG. 5 is a detailed schematic of the preferred embodiment universal qualified clock buffer circuit shown in FIG. 3.

FIG. 5 shows a detailed schematic of the first preferred embodiment of the universal qualified clock buffer circuit of FIG. 3 for generating overlapping clock signal CK1 or non-overlapping clock signal CK1N, shown generally at 500.

The FET sizing listed below in TABLE A is tuned to generate an overlapping clock signal CK1 from a 167 MHz global single-phase clock signal CK using slow FETS, and having a qualifier setup time of 25 psec with respect to the global single-phase clock signal CK. TABLE A specifies the FET sizing for each of the various FETS in the universal qualified clock buffer circuit of FIG. 5.

TABLE A

| FET | SIZE (width/length in microns) |
|-----|-------------------------------|
| 510 | 20/1 |
| 512 | 4/1 |
| 514 | 2/1 |
| 516 | 3.5/1 |
| 518 | 15/1 |
| 520 | 20/1 |
| 522 | 21/1 |
| 524 | 17/1 |
| 526 | 2/1 |
| 528 | 6/1 |
| 530 | 58/1 |
| 532 | 34/1 |
| 534 | 11.4/1 |
| 536 | 8.8/1 |
| 538 | 4.2/1 |
| 540 | 4.6/1 |
| 542 | 1.4/1 |
| 544 | 0.8/1 |
| 546 | 150/1 |
| 548 | 80/1 |
| 550 | 14/1 |
| 552 | 1.4/1 |
| 554 | 8/1 |
| 556 | 8/1 |

Figure 6:
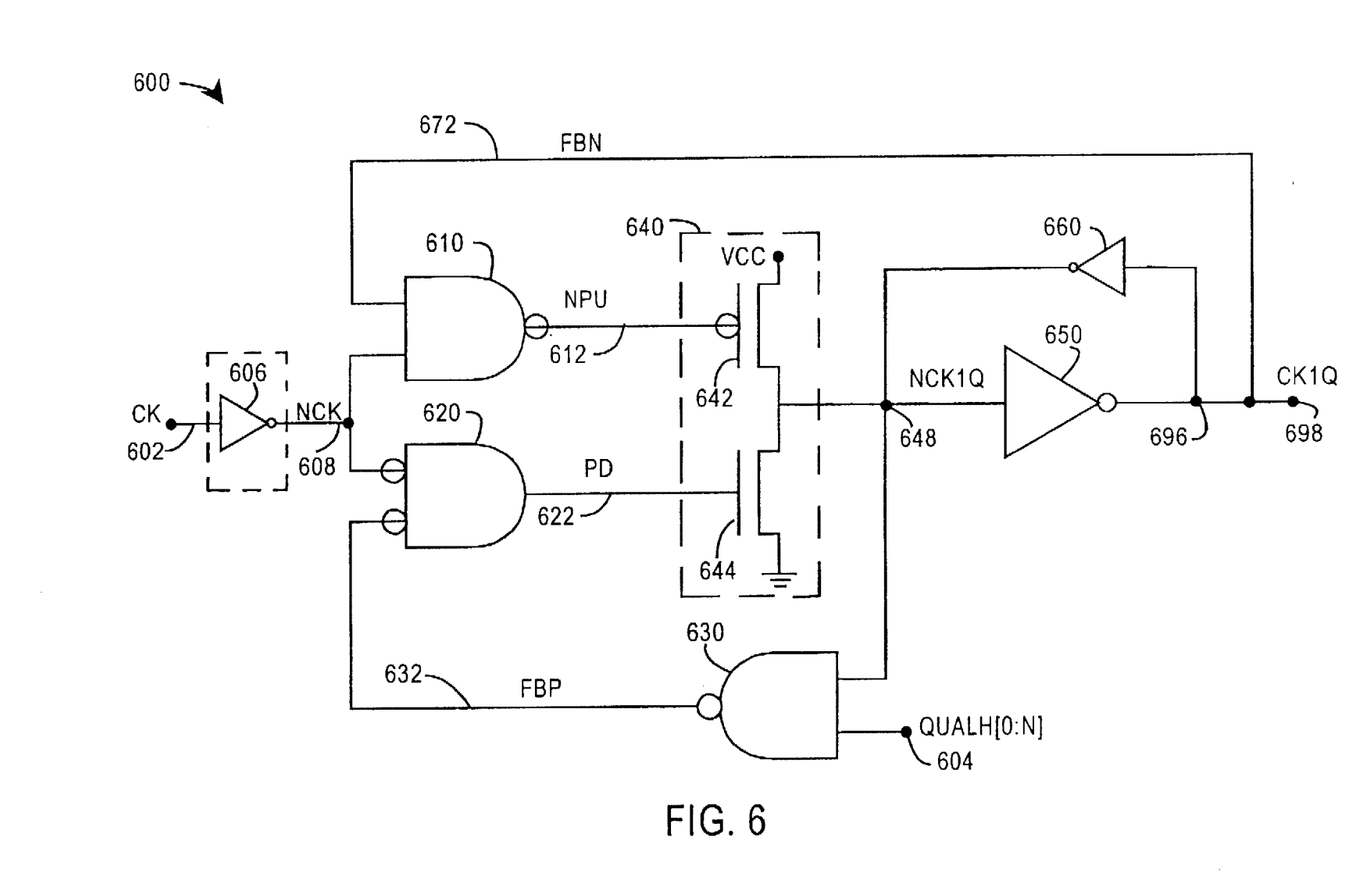
FIG. 6 is a logic diagram of a specific example of the preferred embodiment of a universal qualified clock buffer circuit shown in FIG. 3.

FIG. 6 illustrates a logic diagram of a more specific example of the universal qualified clock buffer circuit of FIG. 3, shown generally at 600. As shown in FIG. 6, the universal qualified clock buffer circuit 600 receives a global single-phase clock signal CK 402, a 1-bit rising-edge qualifier signal QUALH 604. The falling-edge qualifier signal QUALL of FIG. 3 is a zero-bit signal, meaning that the falling edge in this example is not qualified. The structure of the universal qualified clock buffer circuit is otherwise the same as that described with respect to FIG. 3.

Figure 7:
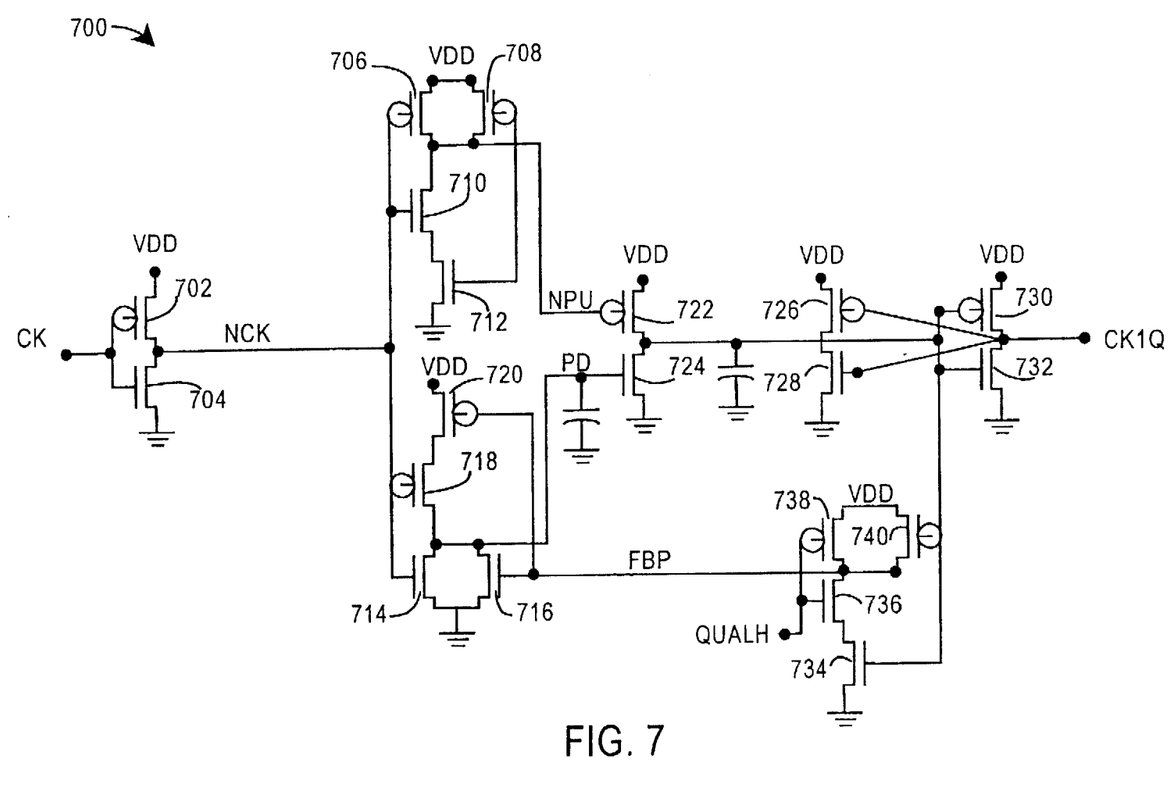
FIG. 7 is a detailed schematic of the universal qualified clock buffer circuit shown in FIG. 6 for generating either an overlapping clock signal CK1 or a non-overlapping clock signal CK1N.

FIG. 7 shows a detailed schematic of the universal qualified clock buffer circuit 600 of FIG. 6 for generating an overlapping clock signal CK1 or a non-overlapping clock signal CK1N, shown generally at 700.

The FET sizing listed below in TABLE B is tuned to generate an overlapping clock signal CK1 from a 167 MHz global single-phase clock signal CK using slow FETS, and having a qualifier setup time of 25 psec with respect to the global single-phase clock signal CK. TABLE B specifies the FET sizing for each of the various FETS in the universal qualified clock buffer circuit of FIG. 7.

TABLE B

| FET | SIZE (width/length in microns) |
|-----|-------------------------------|
| 702 | 23.6/1 |
| 704 | 10.4/1 |
| 706 | 0.8/1 |
| 708 | 3.9/1 |
| 710 | 14.7/1 |
| 712 | 20/1 |
| 714 | 0.8/1 |
| 716 | 6/1 |
| 718 | 17/1 |
| 720 | 23/1 |
| 722 | 58/1 |
| 724 | 34/1 |
| 726 | 2/1 |
| 728 | 0.8/1 |
| 730 | 150/1 |
| 732 | 80/1 |
| 734 | 8/1 |
| 736 | 8/1 |
| 738 | 14/1 |
| 740 | 2/1 |

Using the above FET sizing, the following measurements were taken:

| | |
|---|---|
| CK rising to CK1 rising: | 622 psec |
| CK falling to CK1 falling: | 662 psec |
| CK rising to CK falling: | 2.99 nsec |
| CK1 rising to CK1 falling: | 2.97 nsec. |

The above measurements illustrate a 99% hightime (rising edge to falling edge) retention and a minimized delay (134–291 psec) delay between like edges of the global single-phase clock and the universal qualified clock buffer output signal.

The FET sizing listed below in TABLE C is tuned to generates a non-overlapping clock signal CK1N from a 167 MHz single-phase clock signal, and having a qualifier setup time of −200 psec with respect to the global single-phase clock signal CK (meaning there is zero setup time). TABLE C specifies the FET sizing for each of the various FETS in the universal qualified clock buffer circuit of FIG. 7.

TABLE C

| FET | SIZE (width/length in microns) |
|-----|-------------------------------|
| 702 | 13/1 |
| 704 | 3.2/1 |
| 706 | 0.8/1 |
| 608 | 2/1 |
| 710 | 7/1 |

TABLE C-continued

| FET | SIZE (width/length in microns) |
|---|---|
| 712 | 11/1 |
| 714 | 0.8/1 |
| 716 | 3/1 |
| 718 | 3.8/1 |
| 720 | 6.7/1 |
| 722 | 28/1 |
| 724 | 20/1 |
| 726 | 1/1 |
| 728 | 0.6/1 |
| 730 | 85/1 |
| 732 | 45/1 |
| 734 | 4/1 |
| 736 | 4/1 |
| 738 | 6.6/1 |
| 740 | 1.5/1 |

Using the above FET sizing, the deadtime (CK1 rising to CK1N rising) between CK1 of TABLE B and CK1N of TABLE C was measured at 134–291 psec.

Figure 8:
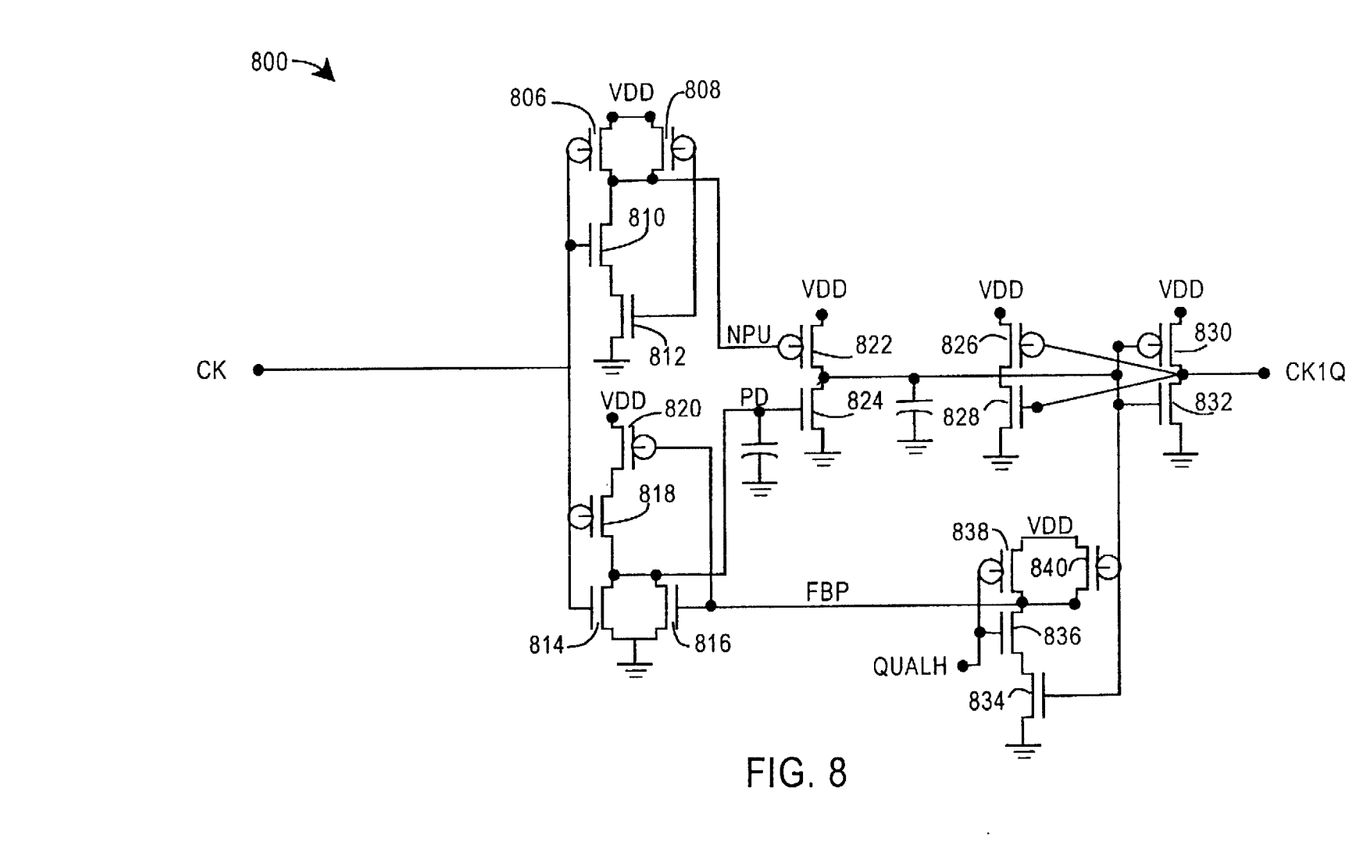
FIG. 8 is a detailed schematic of the universal qualified clock buffer circuit shown in FIG. 6 for generating either an overlapping clock signal CK2 or a non-overlapping clock signal CK2N.

FIG. 8 shows a detailed schematic of the universal qualified clock buffer circuit of FIG. 6 for generating overlapping clock signal CK2 or non-overlapping clock signal CK2N, shown generally at 800. The FET sizing listed below in TABLE D is tuned to generate an overlapping clock signal CK2 from a 167 MHz single-phase clock signal CK, and having a qualifier setup time of 25 psec with respect to the global single-phase clock signal CK. Table D specifies the FET sizing for each of the various FETS in the universal qualified clock buffer circuit of FIG. 8.

TABLE D

| FET | SIZE (width/length in microns) |
|---|---|
| 806 | 2/1 |
| 808 | 3.6/1 |
| 810 | 8/1 |
| 812 | 12.8/1 |
| 814 | 2/1 |
| 816 | 6/1 |
| 818 | 14/1 |
| 820 | 19/1 |
| 822 | 48/1 |
| 824 | 34/1 |
| 826 | 2/1 |
| 828 | 0.8/1 |
| 830 | 150/1 |
| 832 | 80/1 |
| 834 | 8/1 |
| 836 | 8/1 |
| 838 | 14/1 |
| 840 | 2/1 |

Using the above FET sizing, the following measurements were taken:

| | |
|---|---|
| CK falling to CK2 rising: | 629 psec |
| CK rising to CK2 falling: | 668 psec |
| CK rising to CK falling: | 2.99 nsec |
| CK2 rising to CK2 falling: | 2.95 nsec. |

The above measurements illustrate a 99% hightime (rising edge to falling edge) retention and a minimized delay (629–662 psec) delay between like edges of the global single-phase clock and the universal qualified clock buffer output signal.

The FET sizing listed below in TABLE E is tuned to generate a non-overlapping clock signal CK2N having a high time of 2.7 nanoseconds from a 167 MHz single-phase clock signal CK, and having a qualifier setup time of –200 psec with respect to the global single-phase clock signal CK. Table E specifies the FET sizing for each of the various FETS in the universal qualified clock buffer circuit of FIG. 8.

TABLE E

| FET | SIZE (width/length in microns) |
|---|---|
| 806 | 2/1 |
| 808 | 3.9/1 |
| 810 | 7.4/1 |
| 812 | 12.2/1 |
| 814 | 2/1 |
| 816 | 6/1 |
| 818 | 4.8/1 |
| 820 | 7.4/1 |
| 822 | 48/1 |
| 824 | 34/1 |
| 826 | 1.4/1 |
| 828 | 0.8/1 |
| 830 | 150/1 |
| 832 | 80/1 |
| 834 | 8/1 |
| 836 | 8/1 |
| 838 | 14/1 |
| 840 | 1.4/1 |

Using the above FET sizing, the deadtime (CK2 rising to CK2N rising) between CK2 of TABLE D and CK2N of TABLE E was measured at 171–315 psec.

An important aspect of the present invention is that the capacitive gain (input capacitance relative to output capacitance, $C_{input}/C_{output}$) must be very large. The implementations of the universal qualified clock buffer circuit of FIGS. 5, 7 and 8, using the FET sizings shown in TABLES A–E, provide a gain of approximately 10.

Another important aspect of the present invention is that each universal qualified clock buffer circuit must be designed to match the load impedance of the circuit it drives. Since load tend to vary for each independent universal qualified clock buffer circuit, each universal qualified clock buffer circuit must be individually matched. The output capacitance for the implementations of the universal qualified clock buffer circuit of FIGS. 7 and 8, using the FET sizes in TABLES B, C, and E, rate a nominal 1.0 pF output capacitance (0.75 pF<=$C_{out}$<=1.25 pF). The output capacitance for the implementations of the universal qualified clock buffer circuit of FIGS. 7 and 8, using the FET sizes in TABLES D, rate a nominal 0.38 pF output capacitance (0.25 pF<=$C_{out}$<=0.5 pF). As will be obvious to one skilled in the art, the FET sizes can be changed to alter the output capacitance of a given universal qualified clock buffer circuit. In addition, additional capacitors may be added to the implementation to assist in matching the output load impedance.

In order to assist in matching a load impedance, the universal qualified clock buffer circuits may be combined in parallel to drive a load heavier than that rated for a single universal qualified clock buffer circuit. TABLE F, below, illustrates possible combinations of universal qualified clock buffer circuits to connect in parallel in order to meet various example loads. No additional delay is introduced in the universal qualified clock buffer output signal when universal qualified clock buffer circuits are connected in parallel since each universal qualified clock buffer circuit is identically structured.

TABLE F

| Load Capacitance | Universal Curcuit Combination |
| --- | --- |
| .25 pF–.5 pF | 1 (.38 pF nom) circuit |
| .5 pF–.75 pF | 2 (.38 pF nom) circuits |
| .75 pF–1.25 pF | 1 (1 pF nom) circuit |
| 1.25 pF–1.5 pF | 1 (1 pF nom) circuit & 1 (.38 pF nom) circuit |
| 1.5 pF–2.5 pF | 2 (1 pF nom) circuits |

An additional important aspect of the universal qualified clock buffer circuit is its flexibility in generating various delayed edges. Delays are generated by the sizes of the FETs used in implementing the universal qualified clock buffer circuit. Thus, different universal qualified clock buffer circuits may be tuned to generate different delayed edges simply by changing the FET sizes. Since no structural change is required, each universal qualified clock buffer circuit still experiences the same relative delay, and thus clock skew between locally generated universal qualified clock buffer output signals is minimized.

As will also be appreciated by one skilled in the art, the universal qualified clock buffer circuit may be implemented using any convenient logic. For example, the logic diagrams shown in FIGS. 3 and 6 may be implemented with different logic components (such as switching all OR gates with AND gates, all AND gates with OR gates, all NOR gates with NAND gates, and all NAND gates with NOR gates), and the circuit implementations shown in FIGS. 5, 7 and 8 may be implemented using diametrically opposite components (i.e., switching all NFETs with PFETs and all PFETs with NFETS).

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A universal qualified clock buffer circuit for allowing the flexible generation of high gain, low skew qualified local clock signals from a single-ended source, comprising:

a first NAND gate and a first NOR gate, each receiving a single-phase clock signal at respective first NAND input and first NOR input thereof, the first NAND gate producing a pullup signal and the first NOR gate producing a pulldown signal;

a push-pull circuit for receiving the pullup signal and the pulldown signal and for producing an inverted output signal at an inverted output node;

a first inversion device for receiving the inverted output signal and a first zero-to-n bit qualifier signal to produce a first feedback signal for input to the first NOR gate;

a second inversion device for receiving the inverted output signal and a second zero-to-n bit qualifier signal to produce a second feedback signal for input to the first NAND gate;

a output inverter for receiving the inverted output signal and for producing an output signal at an output node; and a feedback inverter having coupled between the output node and the inverted output node for receiving, inverting, and feeding back the output signal to the inverted output node.

2. The universal qualified clock buffer circuit of claim 1, further comprising an input inverter for receiving and inverting the single-phase clock signal, and producing an inverted single-phase clock signal for input to the first NAND gate and the first NOR gate, and to produce the output signal of opposite polarity.

3. The universal qualified clock buffer circuit of claim 1, implemented as a CMOSFET circuit, wherein differences in delay of both rising and falling edges of the output signal can be independently controlled using different FET sizes.

4. The universal qualified clock buffer circuit of claim 1, wherein the output signal is used to drive a load circuit, and the universal qualified clock buffer circuit is implemented to capacitively match an impedance load of the load circuit.

5. The universal qualified clock buffer circuit of claim 1, wherein the first inversion device comprises a one-to-n bit NAND gate, and the second inversion device comprises a one-to-n bit NOR gate.

6. An integrated circuit comprising:

a plurality of universal qualified clock buffer circuits, each generating a respective high gain local clock signal from a single-ended source, and each universal qualified clock buffer circuit comprising:

a first NAND gate and a first NOR gate, each receiving a single-phase clock signal from said single-ended source at respective first NAND input and first NOR input thereof, the first NAND gate producing a pullup signal and the first NOR gate producing a pulldown signal;

a push-pull circuit for receiving the pullup signal and the pulldown signal and for producing an inverted output signal at an inverted output node;

a first inversion device for receiving the inverted output signal and a first zero-to-n bit qualifier signal to produce a first feedback signal for input to the first NOR gate;

a second inversion device for receiving the inverted output signal and a second zero-to-n bit qualifier signal to produce a second feedback signal for input to the first NAND gate;

a output inverter for receiving the inverted output signal and for producing the respective local clock signal at an output node; and a feedback inverter coupled between the output node and the inverted output node for receiving, inverting, and feeding back the respective local clock signal to the inverted output node.

7. The system of claim 6, each universal qualified clock buffer circuit further comprising an input inverter for receiving and inverting the single-phase clock signal, and producing an inverted single-phase clock signal for input to the first NAND gate and the first NOR gate, and to produce the output signal of opposite polarity.

8. The system of claim 6, wherein for each universal qualified clock buffer circuit, the first inversion device comprises a one-to-n bit NAND gate, and the second inversion device comprises a one-to-n bit NOR gate.

9. The system of claim 6, wherein differences in delays of corresponding edges of the respective local clock signals of respective universal qualified clock buffer circuits may be independently controlled by implementing at least one corresponding component of the respective universal qualified clock buffer circuits with different FET sizes.

10. An integrated circuit comprising:

a plurality of universal qualified clock buffer circuits, each generating a respective high gain local clock signal from a single-ended source, and each respective high gain local clock signal comprising one of an overlapping clock signal, a complementary overlapping clock signal, a non-overlapping clock signal, or a substantially complementary non-overlapping clock signal, wherein:

all overlapping clock signals have coincident rising and falling edges, all complementary overlapping clock signals produced have coincident rising and falling edges, all non-overlapping clock signals produced have coincident rising and falling edges, and all complementary non-overlapping clock signals produced have coincident rising and falling edges.

11. The system of claim 10, wherein:

all rising edges of overlapping clock signals are coincident to all falling edges of complementary overlapping clock signals, all falling edges of overlapping clock signals are coincident to all rising edges of complementary overlapping clock signals, all rising edges of non-overlapping clock signals are coincident to all falling edges of complementary non-overlapping clock signals, and all falling edges of non-overlapping clock signals are coincident to all rising edges of complementary non-overlapping clock signals.

12. The system of claim 10, each universal qualified clock buffer circuit being capacitively matched to a respective impedance load of a corresponding load circuit.

* * * * *